(12) United States Patent
Siegrist

(10) Patent No.: US 6,384,367 B1
(45) Date of Patent: May 7, 2002

(54) ELECTRON BEAM VAPORIZER FOR VACUUM COATING SYSTEMS

(75) Inventor: Beat Siegrist, Herrliberg (CH)

(73) Assignee: Satis Vacuum Industries Vertriebs-AG, Baar (CH)

( * ) Notice: Subject to any disclaimer, the term of this patent is extended or adjusted under 35 U.S.C. 154(b) by 0 days.

(21) Appl. No.: 09/564,978

(22) Filed: May 4, 2000

(30) Foreign Application Priority Data

May 4, 1999 (CH) .............................................. 0819/99

(51) Int. Cl.[7] .......................... B23K 15/00; C23C 14/00
(52) U.S. Cl. ................................................. 219/121.15
(58) Field of Search ...................... 219/121.12, 121.15, 219/121.21, 121.33, 121.35; 118/723 EB

(56) References Cited

U.S. PATENT DOCUMENTS 4,700,660 A  10/1987  Levchenko et al.
4,866,239 A  *  9/1989  Egermeier ............. 219/121.15
5,111,022 A  *  5/1992  Harper et al. .......... 219/121.33

FOREIGN PATENT DOCUMENTS

JP     6393855   *  4/1988  ............. 219/121.12
JP     0293063   *  4/1990  ............. 219/121.12

* cited by examiner

Primary Examiner—Samuel M. Heinrich
(74) Attorney, Agent, or Firm—Venable; Gabor J. Kelemen

(57) ABSTRACT

An assembly for a vaporizer for a vacuum coating system includes a crucible having a cavity; a liner accommodated in the cavity for receiving a material to be vaporized; and a spacer arrangement disposed between the inner wall of the crucible and the outer wall of the liner. The spacer arrangement which is disposed about the outer wall of the liner, centers the liner at a set distance from the inner crucible wall.

2 Claims, 1 Drawing Sheet

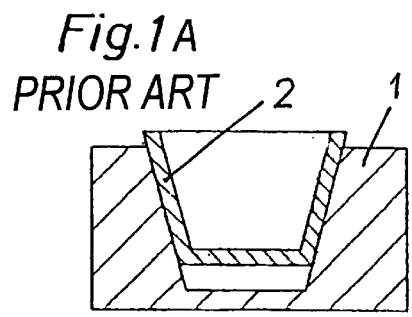
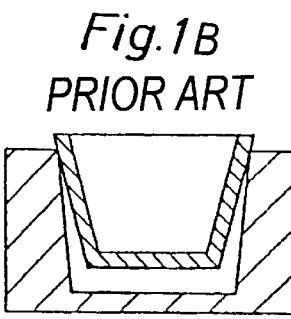
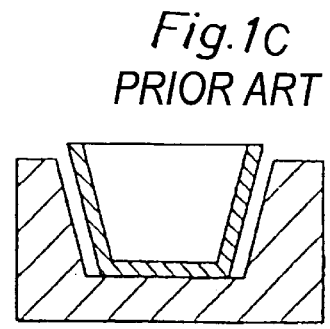
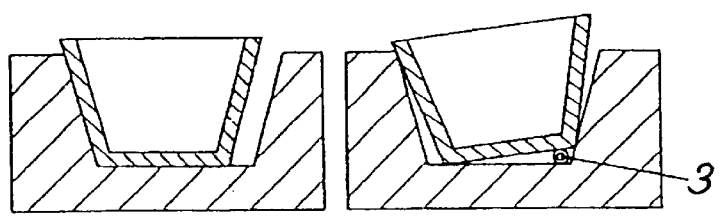
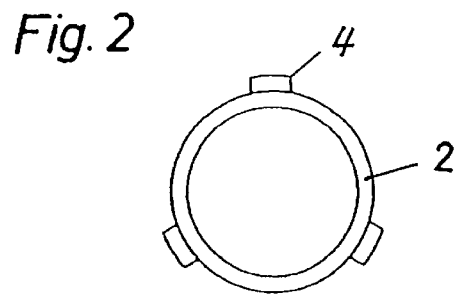
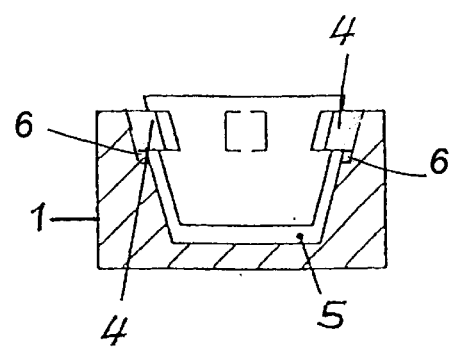
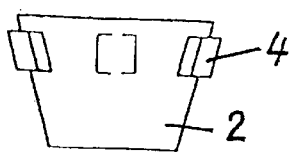

ELECTRON BEAM VAPORIZER FOR VACUUM COATING SYSTEMS

The invention concerns and electron beam vaporizer for vacuum coating systems with at least on crucible that receives a liner which holds the material to be evaporated.

With systems that are used particularly to coat optical substrates in a vacuum that have a gas-tight sealable, evacuatable working vacuum container (recipient) that can be provided with an atmosphere of inert gas, it is very important to precisely position the exchangeable liner holding the respective vaporizable material in the crucible to produce a high-quality coating.

The exchangeable liner holding the respective vaporizable material in the crucible cannot be precisely positioned according to the state of the art as shown in FIG. 1A–1E. The discernible undefined position between the relatively cold copper crucible 1 and the exchangeable, relatively hot liner 2 with the respective vaporizable material produces a highly fluctuating and uncontrolled temperature distribution in the liner.

The even vaporization and heat radiation is disadvantageous, and it produces inferior coats on the substrate to be coated. In addition, outgassing overflow material 3 (FIG. 1E) frequently arises that can change the position of the liner in the crucible during vaporization. High temperature fluctuations in the liner also produce thermomechanical stress that lowers the life of the liners due to wall cracks.

The problem of the present invention is therefore to precisely position the exchangeable liner holding the respective vaporization material in the crucible so that an even, high-quality coating is produced.

This is accomplished according to the invention by centering the liner in the crucible at a set distance from the crucible wall using spacers on the perimeter and possibly against the base.

These measures allow the liner to be clearly and repeatably positioned precisely which ensures even vaporization and heat radiation and hence a high-quality vaporization layer on the substrate to be coated. In addition, the specific distance between the liner and crucible permits the unrestricted and hence pressure-free outgassing of any overflow material.

Thermomechanical stress is also excluded which increases the life of such liners by several times.

In one possible embodiment according to the invention, the spacers are formed by bumps or ribs that extend from and are distributed over the outer wall of the liner or the inner wall of the crucible, or the spacer can be a surrounding projection, or the spacers can key into opposing grooves.

An embodiment of the subject of the invention will be further explained in the following with reference to the drawing. Shown are:

FIG. 1A–1E A liner in a state-of-the-art crucible with various undefined layers between the crucible and the exchangeable liner; and FIG. 2–4 Top and side view of a liner and a section of a liner in a crucible according to the present invention.

As described, the exchangeable liner 2 with the respective vaporization material cannot be precisely positioned in the crucible 1 with the prior-art arrangement shown in FIG. 1A–1E.

Any configuration of the crucibles and hence the associated liners is possible. Usually, the crucibles and corresponding liners are cylindrical with a conically narrowing wall.

FIG. 2–4 shows an exchangeable, precisely positioned liner with the respective vaporization material in the crucible. The liner 2 is centered in the crucible 1 at a set distance 5 by spacers 4 around the perimeter and possibly the base as well.

The spacers 4 can be bumps or ribs that extend from and are distributed over the perimeter of outer wall of the liner (2) or the inner wall of the crucible (1), or the spacer can be a surrounding projection.

Furthermore, the spacers 4 can key into opposing grooves (not shown).

As can be seen, the liner assumes a clear and repeatable precise position in the crucible which guarantees even vaporization and heat radiation and hence a high-quality vaporization layer on the substrate to be coated.

In addition, the specific distance between the liner and crucible allows any overflow material to outgas unrestricted and hence without pressure. In addition, thermomechanical tension is prevented so that the life of the liners is increased several times.

What is claimed is:

1. An assembly for a vaporizer for a vacuum coating system, comprising (a) a crucible having a cavity defined by an inner wall;
   (b) a liner accommodated in said cavity for receiving a material to be vaporized; said liner having an outer wall; and
   (c) a spacer arrangement disposed between said inner wall and said outer wall and disposed about a perimeter of said outer wall for centering said liner at a set distance from said inner wall; said spacer arrangement being formed of one of bumps, ribs and a projection surrounding said outer wall; said spacer arrangement being keyed into opposing grooves.

2. The assembly as defined in claim 1, wherein said liner has a base and further wherein said spacer arrangement engages said base.

* * * * *